(12) United States Patent
Blodgett

(10) Patent No.: US 7,053,702 B2
(45) Date of Patent: May 30, 2006

(54) FEED FORWARD AMPLIFIER

(75) Inventor: James R. Blodgett, Walnut, CA (US)

(73) Assignee: SOMA Networks, Inc., San Francisco, CA (US)

( * ) Notice: Subject to any disclaimer, the term of this patent is extended or adjusted under 35 U.S.C. 154(b) by 13 days.

(21) Appl. No.: 10/432,019

(22) PCT Filed: Nov. 9, 2001

(86) PCT No.: PCT/US01/43030

§ 371 (c)(1),
(2), (4) Date: Mar. 12, 2004

(87) PCT Pub. No.: WO02/43239

PCT Pub. Date: May 30, 2002

(65) Prior Publication Data

US 2004/0155704 A1    Aug. 12, 2004

Related U.S. Application Data

(63) Continuation-in-part of application No. 09/715,085, filed on Nov. 20, 2000, now Pat. No. 6,340,915.

(51) Int. Cl.
*H03F 3/66* (2006.01)

(52) U.S. Cl. .......................... 330/52; 330/151

(58) Field of Classification Search .................. 330/52, 330/151
See application file for complete search history.

(56) References Cited

U.S. PATENT DOCUMENTS

| | | | |
|---|---|---|---|
| 3,471,798 A | 10/1969 | Seidel | 330/149 |
| 3,649,927 A | 3/1972 | Seidel | 330/124 |
| 5,093,668 A | 3/1992 | Sreenivas | 342/374 |
| 5,323,119 A * | 6/1994 | Powell et al. | 330/151 |
| 5,491,454 A | 2/1996 | Matz | 330/149 |
| 5,528,196 A * | 6/1996 | Baskin et al. | 330/151 |
| 5,768,699 A | 6/1998 | Behan et al. | 455/296 |
| 5,796,304 A * | 8/1998 | Gentzler | 330/52 |
| 5,870,668 A | 2/1999 | Takano et al. | 455/126 |
| 5,874,856 A | 2/1999 | Van Horn | 330/151 |
| 5,912,586 A * | 6/1999 | Mitzlaff | 330/151 |
| 5,926,067 A | 7/1999 | Myer et al. | 330/52 |
| 5,963,091 A | 10/1999 | Chen et al. | 330/151 |
| 5,977,825 A | 11/1999 | Mueck | 330/151 |
| 6,166,600 A | 12/2000 | Myer | 330/151 |
| 6,208,204 B1 | 3/2001 | Suzuki et al. | 330/52 |
| 6,340,915 B1 | 1/2002 | Blodgett | 330/52 |

FOREIGN PATENT DOCUMENTS

JP          09-284059       * 10/1997

* cited by examiner

*Primary Examiner*—Khanh V. Nguyen
(74) *Attorney, Agent, or Firm*—Katten, Muchin, Rosenman

(57) ABSTRACT

The present invention provides a novel feed forward amplifier ("FFA") and a pilot tone generator-receiver therefor. In an embodiment of the invention, the feed forward amplifier only requires a single oscillator to operate both the pilot tone generator and pilot tone receiver used in conjunction with the amplifier circuitry of the FFA. In another embodiment of the invention, a method is provided of generating and detecting a pilot tone from a single oscillating signal.

22 Claims, 3 Drawing Sheets

FEED FORWARD AMPLIFIER

This application is a 371 of PCT/US01/43030 filed Nov. 9, 2001 which is a continuation-in-part of Ser. No. 09/715,085 filed Nov. 20, 2000 now U.S. Pat. No. 6,340,915.

FIELD OF THE INVENTION

The present invention relates to amplifier circuits. More specifically, the present invention relates to a feed forward amplifier and to pilot tone generator-receivers therefor.

BACKGROUND OF THE INVENTION

Feed forward amplifiers ("FFA") are well known. Within the art, it is also known to improve the linear behavior of FFAs using a pilot tone. In simple terms, a pilot tone is generated by a pilot tone generator and injected into the signal path prior to the main amplifier. The injected pilot tone is then detected by a pilot tone receiver at the output of the circuit. The detected pilot tone is used to adjust the gain and phase of the output of the correctional amplifier, such that the pilot tone and error or distortion introduced by the main amplifier are substantially eliminated. The overall result is a substantially linear feed forward amplifier. More detailed explanations of pilot tone usage in FFAs can be found in a variety of sources, including U.S. Pat. No. 5,874,856 to Van Horn, the contents of which are incorporated herein by reference.

While the use of a pilot tone can improve the overall linearity of FFAs, current pilot tone generators and receivers tend to add complexity and overall cost to the FFA circuit. For example, current FFA circuits that utilize a pilot tone typically require multiple oscillators—i.e., a first oscillator for the pilot tone generator, and a second oscillator for the pilot tone receiver. Furthermore, these two oscillators must be programmed with complementary frequencies: namely, a first frequency for the first oscillator, and a second frequency for the second oscillator, whereby the second frequency differs from the first frequency by the intermediate frequency ("IF") of the pilot tone receiver. Another problem with using two oscillators is that phase noise, (jitter in the time domain) can exist between the oscillators, thus requiring additional care, cost and/or complexity when designing both the generator and receiver to compensate for such phase noise.

Yet another problem with the prior art is that certain elements in the pilot tone receiver, such as the filter, can be difficult to appropriately size so that they properly complement the correctional amplifier and delay element used in the error signal path of the FFA circuit, thus increasing the overall complexity and cost of designing the FFA.

SUMMARY OF THE INVENTION

It is an object of the present invention to provide a novel feed forward amplifier that obviates or mitigates at least one of the above-identified disadvantages of the prior art.

In an aspect of the invention, there is provided a pilot tone generator-receiver for a feed forward amplifier (FFA). The feed forward amplifier includes a main amplifier and an error correction pathway. The generator-receiver comprises an oscillator for producing a signal and a vector modulator connected to the oscillator. The vector modulator is operable to either add or subtract a modulating frequency to or from, respectively, the signal in order to generate a pilot tone that is suitable for injection prior to the main amplifier. The generator-receiver also includes a receiver circuit connected to the oscillator, which is for detecting a pilot tone from an output of the feed forward amplifier. The receiver circuit is operable to use the detected pilot tone to modify the controls of the error correction pathway, such that the error pathway is then operable to introduce a signal at the output of the feed forward amplifier that substantially eliminates the pilot tone and any error introduced by the main amplifier.

In another aspect of the invention, there is provided a method for generating and receiving a pilot tone for a feed forward amplifier having a main amplifier, an error correction pathway, and an output pathway, the method comprising the steps of: producing an oscillating signal; applying a vector modulation to the oscillating signal to produce a pilot tone; injecting the pilot tone prior to the main amplifier; mixing the oscillating signal with a measured output of the output pathway to produced a mixed signal; filtering an intermediate frequency from the mixed signal to produce a filtered signal; and, detecting the pilot tone from the filtered signal.

In another aspect of the present invention, there is provided a feed forward amplifier comprising: an amplifier portion having a main amplifier and an error correction pathway; a pilot tone generator-receiver having an oscillator for producing a signal; a vector modulator connected to said oscillator and for either adding or subtracting a modulating frequency to or from, respectively, said signal in order to generate a pilot tone suitable for injection prior to said main amplifier; and, a receiver circuit connected to said oscillator and for detecting a pilot tone from an output of said feed forward amplifier to control said error correction pathway in order to substantially eliminate said pilot tone and any error introduced by said main amplifier.

The present invention can reduce expense and complexity over certain prior art FFAs. For example, in various aspects of the present invention, a feed forward amplifier is provided that only requires a single oscillator to generate a pilot tone and provide an oscillating signal for pilot tone receiver circuitry. In contrast, certain prior art FFAs can require two oscillators; one for the pilot tone generator and one for the pilot tone receiver. In another embodiment of the invention, a method is provided of generating and detecting a pilot tone from a single oscillating signal.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

Figure 1:
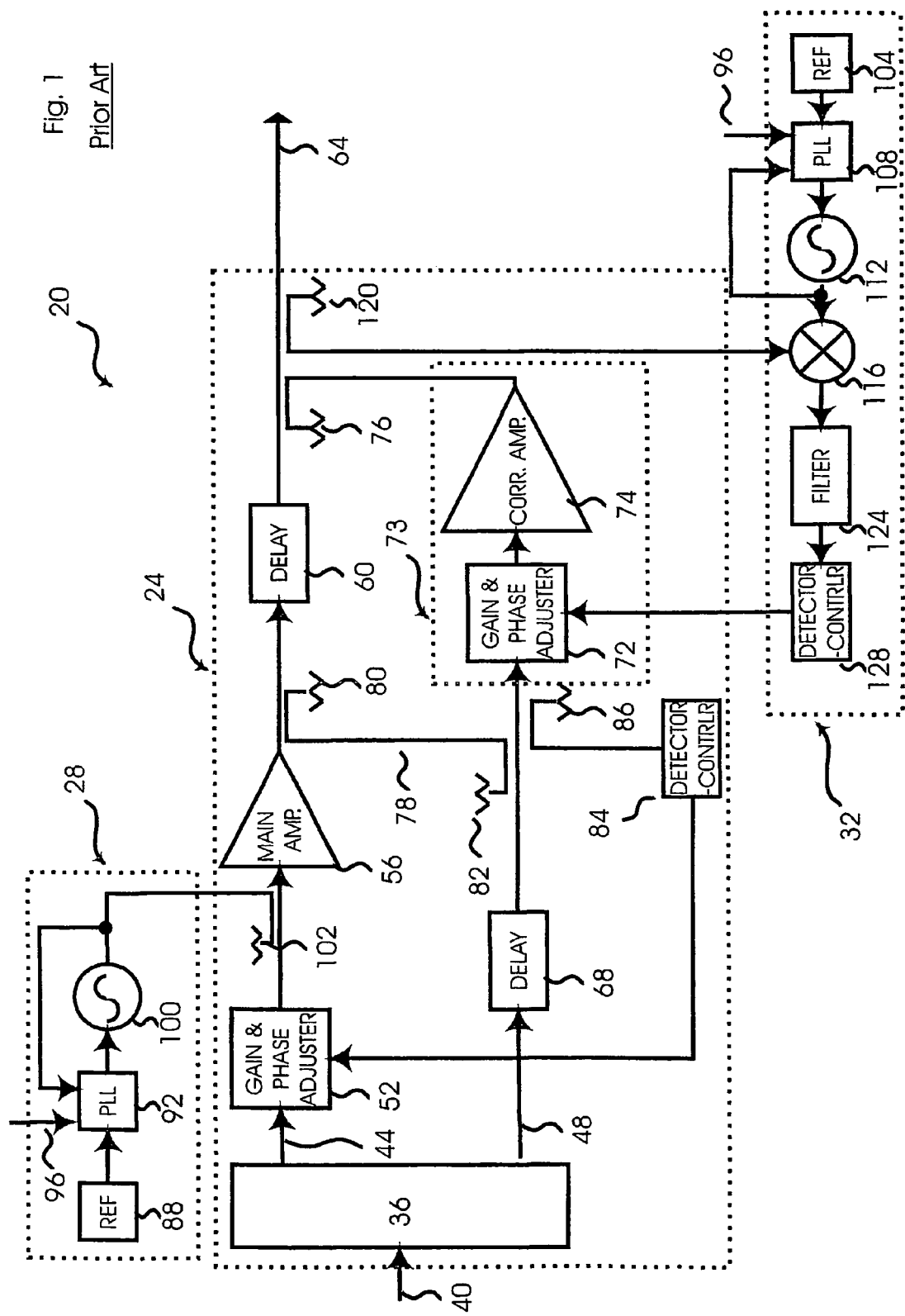
FIG. 1 is a block diagram of a prior art feed forward amplifier.

Referring now to FIG. 1, a prior art feed forward amplifier ("FFA") is indicated generally at 20. FFA 20 comprises an amplifier portion 24, a pilot tone generator 28, and a pilot tone receiver 32.

Amplifier portion 24 includes a coupler 36 that is connected to an input signal path 40. Coupler 36 is operable to split an incoming signal from path 40 into a first signal path 44 and a second signal path 48. First signal path 44, which carries the main signal from coupler 36, is characterized by a gain and phase adjuster 52, a main amplifier 56 and a delay element 60 that outputs to an output signal path 64. Second signal path 48, which carries a sample of the input signal generated by coupler 36, is characterized by a delay element 68, a gain and phase adjuster 72 and a correctional amplifier 74, the output of which connects to output signal path 64 via a coupler 76. Those of skill in the art will recognize that adjuster 72 and correctional amplifier 74 form an error correction pathway 73 within amplifier portion 24. Accordingly, when the output of correctional amplifier 74 is coupled to the output of delay 60, error and pilot tones are substantially eliminated from the output signal path 64, such that the output signal path 64 represents a substantially linear amplification of input signal path 40.

Amplifier portion 24 is further characterized by a coupled path 78 that interconnects a first coupler 80 (which is connected to the output of main amplifier 56) and a second coupler 82 (which is connected to the output of delay element 68), in order to provide a sample of the error introduced by main amplifier 56 to the error correction pathway 73 commencing at adjuster 72. Additionally, a detector-controller 84 connects to the input of adjuster 72, via a coupler 86, in order to measure the total power just prior to adjuster 72. Detector-controller 84 uses the measurement to modify the controls of adjuster 52 in order to minimize the level of the total power. The remaining power coupled through path 78, which consists of the pilot tone and any intermodulation products created in the main amplifier 56, is fed to error pathway 73.

Pilot tone generator 28 includes a reference signal generator 88 that provides a reference signal to a phase locked loop (PLL) chip 92. (While not expressly shown in FIG. 1, those of skill in the art will recognize that PLL chip 92 includes both PLL circuitry and loop filter circuitry). PLL chip 92 is operable to receive a programming input 96 to allow a user to set a suitable pilot tone for use in FFA 20. PLL chip 92 connects to an oscillator 100, which feeds its output back to PLL chip 92, while also injecting its output into amplifier portion 24 via a coupler 102, just prior to the input of main amplifier 56. Thus, overall, pilot tone generator 28 is operable to inject a pilot tone into main amplifier 56.

Pilot tone receiver 32 includes a reference signal generator 104 that provides a reference signal to a PLL chip 108. PLL chip 108 is also operable to receive the same programming input 96 which is introduced to PLL chip 92 of pilot tone generator 28 to ensure that the pilot tone received at receiver 32 will correspond with the pilot tone generated by pilot tone generator 28. PLL chip 108 is tunable to a frequency that is different from PLL chip 92 by an amount equal to the intermediate frequency of filter 124. The difference can either be less or more than the frequency of PLL 92 depending on desired system parameters. PLL chip 108 connects to an oscillator 112, which feeds its output back to PLL chip 108 in order to correct the rate of oscillation in the usual manner. Accordingly, oscillator 112 operates at the frequency controlled by PLL chip 92. Those of skill in the art will now recognize that this is one of the disadvantages of the prior art, in that two oscillators are required for FFA 20, thereby increasing the overall cost and complexity of FFA 20.

The output of oscillator 112 is also directed to a mixer 116, which also receives input from a coupler 120 joined to output signal path 64. The output of mixer 116 is presented to a filter 124, which is selected to match the intermediate frequency, as determined from the difference in frequency between oscillator 100 and 112. The filtered signal outputted from filter 124 is inputted to a detector-controller 128, which detects the pilot tone received at coupler 120 and modifies the controls of adjuster 72 in order to minimize the level of the pilot tone. Thus, overall, pilot tone receiver 32 is operable to detect the pilot tone at output signal path 64 and use the level of the pilot tone to modify gain and phase adjuster 72 so as to minimize the level of the pilot tone at coupler 120.

The operation of prior art FFA 20 will now be discussed with reference to the foregoing and FIG. 1. A signal is introduced to input signal path 40 where it is split into first signal path 44 and second signal path 48. A pilot tone is injected into first signal path 44 just prior to main amplifier 56 by pilot tone generator 28. The output along signal output path 64 is monitored by pilot tone receiver 32, which detects the magnitude of the pilot tone and directs it to adjuster 72. Adjuster 72 also receives, via coupled path 78, output from main amplifier 56. Correcting amplifier 74 then uses the output from gain and phase adjuster 72 to generate an output that is injected into output signal path 64 via coupler 76, such that the pilot tone and any error introduced by main amplifier 56 are substantially eliminated.

A feed forward amplifier in accordance with an embodiment of the present invention will now be discussed with reference to FIG. 2, and is indicated generally at 20a. FFA 20a includes an amplifier portion 24 which, in a present embodiment, is identical to amplifier portion 24 of the prior art FFA 20 discussed above. Accordingly, the individual components of amplifier 24 in FFA 20a are identical to amplifier portion 24 of FFA 20, and accordingly, are indicated with the same reference numbers as amplifier 24 in FIG. 1.

FFA 20a also includes a pilot tone generator-receiver 132, which includes a reference signal generator 136 that provides a reference signal to a PLL chip 140. PLL chip 140 is operable to receive a programming input 96a (which can be the same as the programming input 96 discussed in the prior art shown in FIG. 1) which is introduced to PLL chip 140 of pilot tone generator-receiver 132 in order to allow a user to set a desired pilot tone for FFA 20a. PLL chip 140 connects to an oscillator 144, that is operable to generate a signal at the desired pilot tone frequency, plus or minus the intermediate frequency. Oscillator 144 feeds its output back to phase locked loop chip 140 in order to correct the desired rate of oscillation the usual manner.

Oscillator 144 also outputs its signal to a vector modulator 160 that generates a pilot tone for injection into amplifier portion 24 at a coupler 102a, just prior to main amplifier 56. Vector modulator 160 produces the pilot tone from the signal produced by oscillator 144 by adding or subtracting a desired modulating frequency (Fm) to the oscillator signal. The addition or subtraction of the modulating frequency is selectable by the phase reference given to the SIN and COS inputs of modulator 160. These SIN and COS inputs can be operated with a digital signal processor (DSP) or other type of master controller for FFA 20a, as will occur to those of skill in the art.

Any suitable modulation frequency can be chosen. One suitable range of frequencies from which the modulating frequency (Fm) can be the chosen is any frequency that is less than about one megahertz (1 MHz). However, other ranges of frequencies can be from near direct current to about fifty megahertz. Yet another range of frequencies can be from about ten kilohertz to about ten megahertz. In the present embodiment however, a modulating frequency of four-hundred-and-fifty kilohertz (450 kHz) is presently preferred, due to the ready-supply of 450 kHz IF filters. The output of vector modulator 160 thus presents an accurate pilot tone, which can be injected into amplifier portion 24 of FFA 20a at coupler 102a, in the substantially same manner the pilot tone was injected at coupler 102 in the prior art FFA 20 discussed above.

The output of oscillator 144 is also directed to pilot tone receiver circuitry, which in a present embodiment includes a mixer 148 that also receives input from a coupler 120a joined to output signal path 64. The output of mixer 148 is then presented to a filter 150, which has a center of its intermediate frequency that is sized to correspond with the modulating frequency (Fm). The filtered signal outputted from filter 150 is then inputted to a detector-controller 154, which detects the pilot tone received at coupler 120a and makes adjustments to adjuster 72 in order to minimize the level of the pilot tone.

Table I shows a table of exemplary part numbers for use in pilot tone generator-receiver 132.

TABLE I

Figure 2:
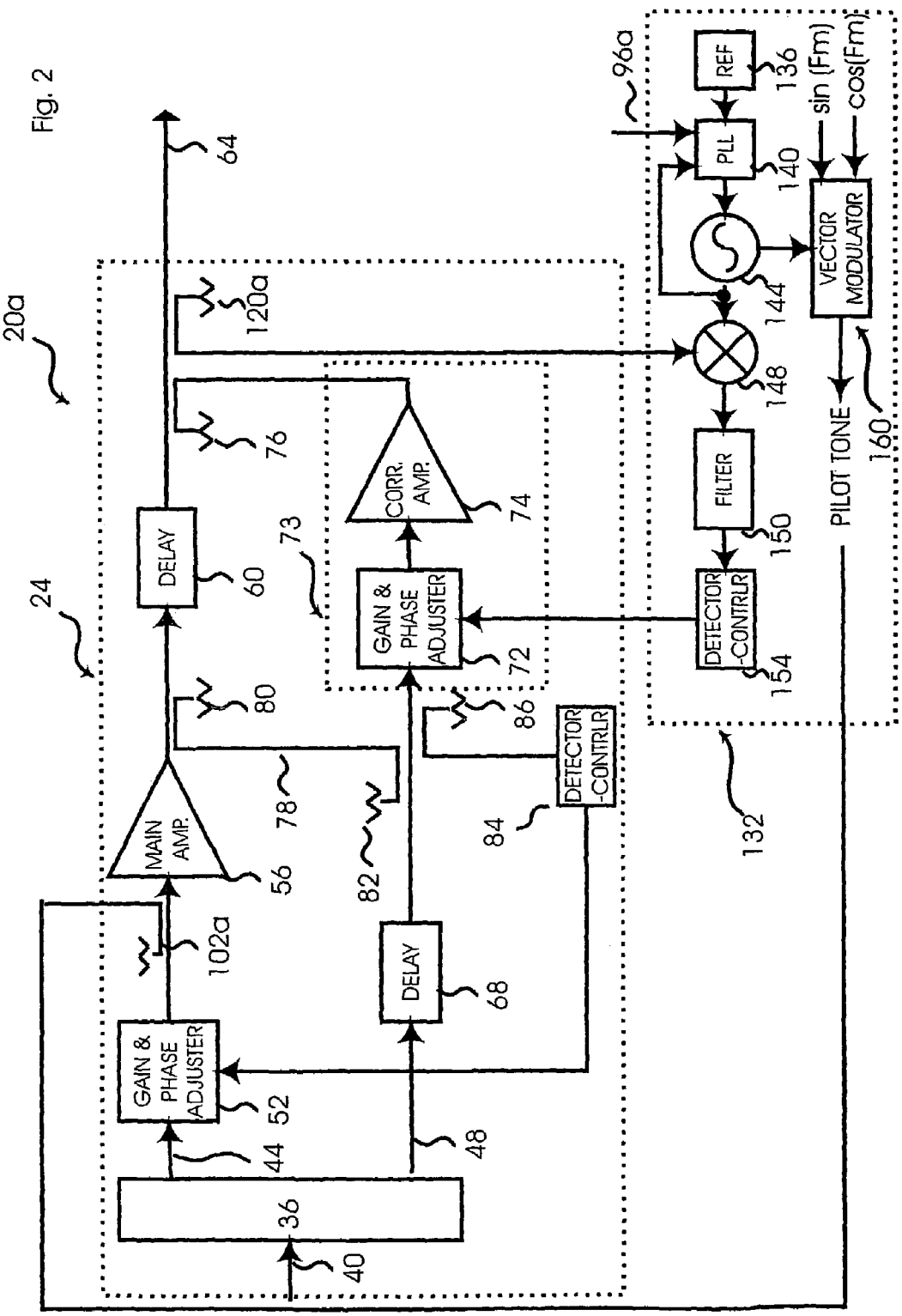
FIG. 2 is a block diagram of a feed forward amplifier according to an embodiment of the invention; and, FIG. 3 is a flow chart showing a method of generating and receiving a pilot tone in accordance with another embodiment of the invention.

| Item Name | Reference Number in FIG. 2 | Part Supplier | Part Number |
|---|---|---|---|
| Vector Modulator | 160 | RF Micro Devices, Inc. 5550 Scotts Valley Drive, Suite 400 Scotts Valley, CA 95066 | RF2422 |
| Oscillator | 144 | Z~Communications Inc. 9939 Via Pasar San Diego, CA 92126 | V622ME10 |
| PLL chip | 140 | National Semiconductor 2900 Semiconductor Drive P.O. Box 58090 Santa Clara, CA 95052-8090 | LMX2326 |
| Filter | 150 | Murata Electronics 2200 Lake Park Drive Smyra, GA 30080 7604, | CFUX450C100H |
| Detector-controller | 154 | Analog Devices | AD8310 (detector) ADSP-2186 (DSP controller) |
| Mixer | 148 | Mini-Circuits | SYM-22H |

A method of generating and receiving a pilot tone, in accordance with another embodiment of the invention, will now be discussed with reference to the flow-chart shown in FIG. 3. In order to assist in the explanation of the method, reference will be made to FFA20a shown in FIG. 2, and the above discussion. At step 300, an oscillating signal is produced. In a present embodiment, oscillator 144 produces the oscillating signal, however, other ways of producing an oscillating signal will occur to those of skill in the art. While not critical, it is presently preferred that the oscillating signal is any signal that does not include frequencies which will be amplified by FFA 20a Further functionality is provided in FFA 20a by including input 96a to allow a user to set the frequency of the oscillating signal. PLL chip 140 and reference signal 136 provide further input and control over oscillator 144 to ensure that a reliable oscillating frequency is produced. In general, it is to be understood that any means for producing an oscillating signal that is usable for pilot tone generation and detection can be used, and thus other functional equivalents will occur to those of skill in the art.

At step 305, a vector modulation is applied to the oscillating signal produced at step 100 in order to generate a pilot tone. In a present embodiment, the vector modulation is performed by vector modulator 160, which, depending on the phase relationship of a SIN(Fm) input and a COS(Fm) input being received, vector modulator 160 will add or subtract a desired modulating frequency thus generating a pilot tone at the output of vector modulator 160. In other embodiments, it is to be understood that any means for applying a desired vector modulation to the oscillating signal can be used, or any means for adding (or subtracting) a modulating frequency to (or from, respectively) the oscillating signal can be used, and thus other types of equipment for performing step 305 will occur to those of skill in the art.

At step 310, the pilot tone is injected prior to the main amplifier. In a present embodiment, the pilot tone is injected through coupler 102a which is located just prior to main amplifier 56, however, other means for injecting the pilot tone into amplifier portion 24 will occur to those of skill in the art.

Having injected the pilot tone, amplifier portion 24 behaves in the usual manner, namely the main signal and the injected pilot tone are amplified by main amplifier 56. After experiencing a delay at delay element 60, the amplified signal is output from delay element 60 along output signal path 64. Additionally, a sample of the amplified signal generated by amplifier 56 is directed into the error pathway.

At step 315, the oscillating signal produced at step 100 is mixed with a measured output of the amplifier portion. In a present embodiment, the measured output is obtained via coupler 120a, which is joined to output signal path 64. The measured output is mixed using mixer 148, which outputs the mixed signals to filter 150.

At step 320, the intermediate frequency is filtered from the mixed signal. In a present embodiment, this step is accomplished by filter 150, which presents the filtered signal to detector-controller 154, however, other filter means operable to filter the intermediate frequency from the mixed signal are within the scope of the invention.

At step 325, the pilot tone is detected from the filtered signal. In a present embodiment, this is accomplished by detector-controller 154.

At step 330, the controls of error correction pathway 73 are modified to minimize the level of the detected pilot signal. In a present embodiment, the adjustment is performed by detector-controller 154, which utilizes the detected pilot tone from step 325. The modification is performed on adjuster 72 within error correction pathway 73.

Figure 3:
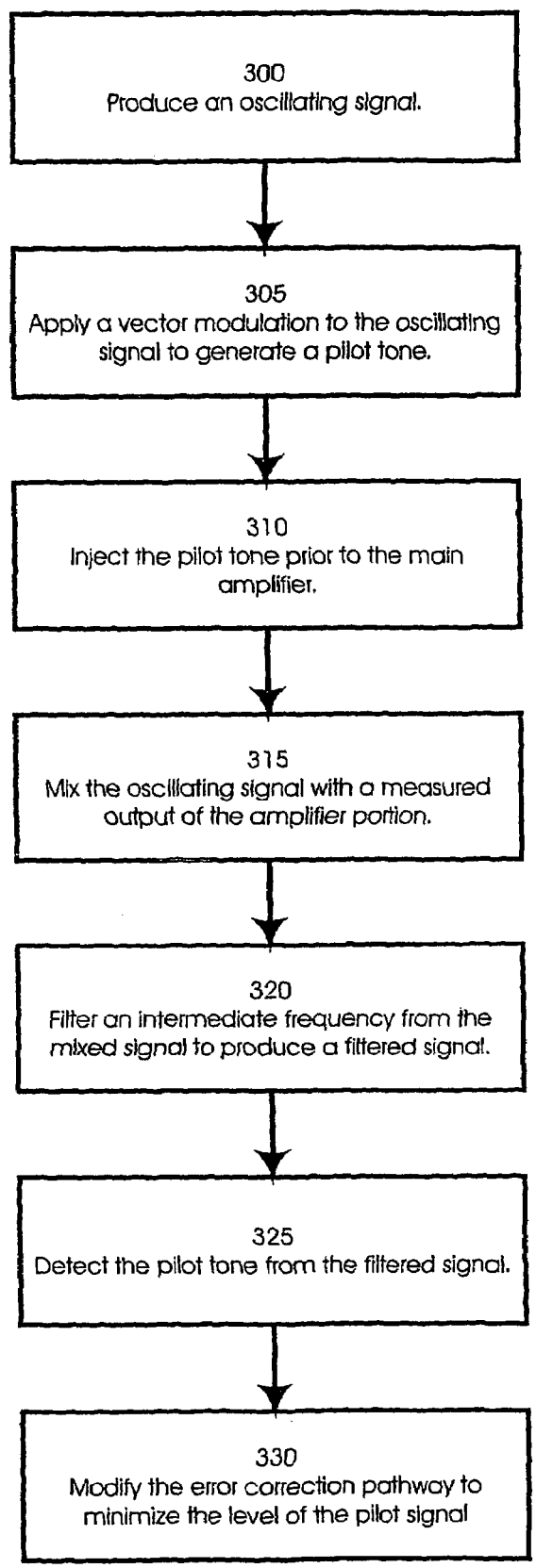

It will now be understood by those of skill in the art that the steps 300–330 continuously cycle, and need not occur in the exact order as shown in FIG. 3.

While the embodiments discussed herein are directed to specific implementations of the invention, it will be understood that combinations, sub-sets and variations of the embodiments are within the scope of the invention. For example, while presently less preferred, in other embodiments of the invention it is contemplated that vector modulator 160 can be eliminated, and substituted with a phase shifter or phase adjustment means for adaptively adjusting the phase of the oscillating signal generated by oscillator 144. The phase adjustment means can be placed in any suitable location, such as either prior to coupler 102a where the pilot tone is injected, or it can be located between mixer 148 and oscillator 144. The signal generated by oscillator 144 will be the pilot tone as well as the local oscillator for the pilot tone receiver. In this example, means are provided to maintain a desired phase relationship between the pilot tone at coupler 120a and the signal coming from oscillator 144, at the inputs to mixer 148. Additional means are provided to adaptively control the phase adjustment means to compensate for temperature and component variation. According to this variation, regardless of where the phase adjustment means is located, the output of mixer 148 is a DC voltage that corresponds to the level of the pilot tone received at coupler 120*a*. Those of skill in the art will thus recognize that this variation is a "zero-IF" system.

The present invention provides a novel feed forward amplifier. The feed forward amplifier includes any circuitry commonly found in the amplifier portion of feed forward amplifiers, and also includes a pilot tone generator-receiver that, when incorporated into a complete feed forward amplifier, only requires a single oscillator in order to allow the feed forward amplifier to produce a substantially error-free, linear amplification. Because only a single oscillator is required, the present invention is generally easier to implement, and less costly, than the two-oscillator systems of in the prior art. Furthermore, the pilot tone generator-receiver of the present invention can be implemented using readily-available vector modulators, in order to obtain a pilot tone generator combined with a pilot tone receiver circuit. By using a common oscillator, tedious and complex matching of filters and detector-controllers in the pilot tone receiver with the elements of the pilot tone generator can be obviated. Additionally, because one oscillator is used for both pilot tone generation and reception, it is largely possible to cancel the phase noise produced by the oscillator yielding a lower noise IF signal and a generally more sensitive pilot tone receiver.

The above-described embodiments of the invention are intended to be examples of the present invention and alterations and modifications may be effected thereto, by those of skill in the art without departing from the scope of the invention, as defined by the claims attached hereto.

I claim:

1. A pilot-tone generator-receiver for a feed-forward amplifier having a main amplifier and an error-correction pathway, the generator-receiver operable both to generate a pilot tone for injection prior to the main amplifier and to detect the pilot tone in the output of the feed-forward amplifier, the pilot-tone generator-receiver comprising:
    an oscillator operable to produce an oscillating signal;
    a means for either increasing or decreasing the frequency of the oscillating signal by an intermediate frequency so as to generate the pilot tone, so that the frequency of the pilot tone injected prior to the main amplifier is either greater than or less than the frequency of the oscillating signal by the intermediate frequency; and
    a receiver circuit connected to the oscillator and to the error-correction pathway for detecting the level of the pilot tone in an output of the feed-forward amplifier, the receiver circuit connected to the error-correction pathway so that the error-correction pathway is operable introduce a correctional signal prior to the output of the feed-forward amplifier in order to substantially eliminate the pilot tone and any error introduced by the main amplifier from the output of the feed-forward amplifier.

2. The pilot-tone generator-receiver of claim 1, wherein the receiver circuit comprises:
    a mixer for mixing a portion of the output of the feed forward amplifier with the oscillating signal to produce a mixed signal;
    a filter for filtering the mixed signal to pass the intermediate frequency so as to produce a filtered signal; and
    a detector connected to the filter for detecting the level of the filtered signal.

3. The pilot-tone generator-receiver of claim 2, wherein the filter comprises a band pass filter centered at the intermediate frequency.

4. The pilot-tone generator-receiver of claim 1, wherein the means for either increasing or decreasing the frequency of the oscillating signal comprises a vector modulator connected to the oscillator.

5. The pilot-tone generator-receiver of claim 1, wherein the frequency of the oscillating signal is about four-hundred-and-fifty kilohertz.

6. A pilot-tone generator-receiver for a feed-forward amplifier having a main amplifier and an error-correction pathway, the generator-receiver operable both to generate a pilot tone for injection prior to the main amplifier and to detect the pilot tone in the output of the feed-forward amplifier, the pilot-tone generator-receiver comprising:
    an oscillator operable to produce a oscillating signal;
    a means for either increasing or decreasing the frequency of the oscillating signal by an intermediate frequency so as to generate the pilot tone, so that the frequency of the pilot tone is either greater than or less than the frequency of the oscillating signal by the intermediate frequency;
    a receiver circuit connected to the oscillator and to the error-correction pathway for detecting the level of the pilot tone in an output of the feed-forward amplifier, the receiver circuit connected to the error-correction pathway so that the error-correction pathway is operable to introduce a correctional signal prior to the output of the feed-forward amplifier in order to substantially eliminate the pilot tone and any error introduced by the main amplifier from the output of the feed-forward amplifier; and
    a phased lock loop chip and reference signal chip connected to the oscillator for maintaining the oscillating signal within desired parameters.

7. A pilot-tone generator-receiver for a feed-forward amplifier having a main amplifier and an error-correction pathway, the generator-receiver operable both to generate a pilot tone for injection prior to the main amplifier and to detect the pilot tone in the output of the feed-forward amplifier, the pilot-tone generator-receiver comprising:
    an oscillator operable to produce a oscillating signal;
    a means for either increasing or decreasing the frequency of the oscillating signal by an intermediate frequency so as to generate the pilot tone, so that the frequency of the pilot tone is either greater than or less than the frequency of the oscillating signal by the intermediate frequency;
    a receiver circuit connected to the oscillator and to the error-correction pathway for detecting the level of the pilot tone in an output of the feed-forward amplifier, the receiver circuit connected to the error-correction pathway so that the error-correction pathway is operable to introduce a correctional signal prior to the output of the feed-forward amplifier in order to substantially eliminate the pilot tone and any error introduced by the main amplifier from the output of the feed-forward amplifier; and
    a means for programming the frequency of the oscillating signal.

8. A pilot-tone generator-receiver for a feed-forward amplifier having a main amplifier and an error-correction pathway, the generator-receiver operable both to generate a pilot tone for injection prior to the main amplifier and to detect the pilot tone in the output of the feed-forward amplifier, the pilot-tone generator-receiver comprising:

an oscillator operable to produce the pilot tone;
a means for either increasing or decreasing the frequency of the pilot tone by an intermediate frequency so as to a generate a frequency-translated signal, so that the frequency of the frequency-translated signal is greater than or less than the frequency of the pilot tone by the intermediate frequency; and
a receiver circuit connected to the means for either increasing or decreasing the frequency of the pilot tone and to the error-correction pathway for detecting the level of the pilot tone in an output of the feed forward amplifier, the receiver circuit connected to the error-correction pathway so that the error-correction pathway is operable to introduce a correctional signal prior to the output of the feed-forward amplifier in order to substantially eliminate the pilot tone and any error introduced by the main amplifier from the output of the feed-forward amplifier.

9. The pilot-tone generator-receiver of claim 8, wherein the receiver circuit comprises:
a mixer for mixing a portion of the output of the feed forward amplifier with the frequency-translated signal to produce a mixed signal;
a filter for filtering the mixed signal to pass the intermediate frequency so as to produce a filtered signal; and
a detector connected to the filter for detecting the level of the filtered signal.

10. The pilot-tone generator-receiver of claim 9, wherein the filter comprises a band pass filter centered at the intermediate frequency.

11. The pilot-tone generator-receiver of claim 8, wherein the means for either increasing or decreasing the frequency of the pilot tone comprises a vector modulator connected to the oscillator.

12. The pilot-tone generator-receiver of claim 8, wherein the frequency of the signal produced by the oscillator is about four-hundred-and-fifty kilohertz.

13. A pilot-tone generator-receiver for a feed-forward amplifier having a main amplifier and an error-correction pathway, the generator-receiver operable both to generate a pilot tone for injection prior to the main amplifier and to detect the pilot tone in the output of the feed-forward amplifier, the pilot-tone generator-receiver comprising:
an oscillator operable to produce the pilot tone;
a means for either increasing or decreasing the frequency of the pilot tone by an intermediate frequency so as to a generate a frequency-translated signal, so that the frequency of the frequency-translated signal is greater than or less than the frequency of the pilot tone by the intermediate frequency; and
a receiver circuit connected to the means for either increasing or decreasing the frequency of the pilot tone and to the error-correction pathway for detecting the level of the pilot tone in an output of the feed forward amplifier, the receiver circuit connected to the error-correction pathway so that the error-correction pathway is operable to introduce a correctional signal prior to the output of the feed-forward amplifier in order to substantially eliminate the pilot tone and any error introduced by the main amplifier from the output of the feed-forward amplifier, and
a phased lock loop chip and reference signal chip connected to the oscillator for maintaining the pilot tone produced by the oscillator within desired parameters.

14. A pilot-tone generator-receiver for a feed-forward amplifier having a main amplifier and an error-correction pathway, the generator-receiver operable both to generate a pilot tone for injection prior to the main amplifier and to detect the pilot tone in the output of the feed-forward amplifier, the pilot-tone generator-receiver comprising:
an oscillator operable to produce the pilot tone;
a means for either increasing or decreasing the frequency of the pilot tone by an intermediate frequency so as to a generate a frequency-translated signal, so that the frequency of the frequency-translated signal is greater than or less than the frequency of the pilot tone by the intermediate frequency;
a receiver circuit connected to the means for either increasing or decreasing the frequency of the pilot tone and to the error-correction pathway for detecting the level of the pilot tone in an output of the feed forward amplifier, the receiver circuit connected to the error-correction pathway so that the error-correction pathway is operable introduce a correctional signal prior to the output of the feed-forward amplifier in order to substantially eliminate the pilot tone and any error introduced by the main amplifier from the output of the feed-forward amplifier; and
a means for programming the frequency of the signal produced by the oscillator.

15. A pilot-tone generator-receiver for a feed-forward amplifier having a main amplifier and an error-correction pathway, the generator-receiver operable both to generate a pilot tone for injection prior to the main amplifier and to detect the pilot tone in the output of the feed-forward amplifier, the pilot-tone generator-receiver comprising:
an oscillator operable to produce a oscillating signal;
a phase shifter for shifting the phase of the oscillating signal to generate a pilot tone for injection prior to the main amplifier that has a phase differing from the phase of the oscillating signal and that is not further modified prior to injection; and
a receiver circuit connected to the oscillator and to the error-correction pathway for detecting the level of the pilot tone in an output of the feed forward amplifier, the receiver circuit connected to the error-correction pathway so that the error-correction pathway is operable to introduce a correctional signal prior to the output of the feed-forward amplifier in order to substantially eliminate the pilot tone and any error introduced by the main amplifier from the output of the feed-forward amplifier.

16. The pilot-tone generator-receiver of claim 15, wherein the receiver circuit comprises:
a mixer for mixing a portion of the output of the feed forward amplifier with the oscillating signal to produce a DC voltage corresponding to the level of the pilot tone in the output of the feed forward amplifier.

17. A pilot-tone generator-receiver for a feed-forward amplifier having a main amplifier and an error-correction pathway, the generator-receiver operable both to generate a pilot tone for injection prior to the main amplifier and to detect the pilot tone in the output of the feed-forward amplifier, the pilot-tone generator-receiver comprising:
an oscillator operable to produce a oscillating signal and including a means for programming the frequency of the oscillating signal;
a phase shifter for shifting the phase of the oscillating signal to generate a pilot tone for injection prior to the main amplifier; and
a receiver circuit connected to the oscillator and to the error-correction pathway for detecting the level of the pilot tone in an output of the feed forward amplifier, the receiver circuit connected to the error-correction pathway so that the error-correction pathway is operable to introduce a correctional signal prior to the output of the feed-forward amplifier in order to substantially eliminate the pilot tone and any error introduced by the main amplifier from the output of the feed-forward amplifier, wherein the receiver circuit comprises a mixer for mixing a portion of the output of the feed forward amplifier with the oscillating signal to produce a DC voltage corresponding to the level of the pilot tone in the output of the feed forward amplifier.

18. A pilot-tone generator-receiver for a feed-forward amplifier having a main amplifier and an error-correction pathway, the generator-receiver operable both to generate a pilot tone for injection prior to the main amplifier and to detect the pilot tone in the output of the feed-forward amplifier, the pilot-tone generator-receiver comprising:
an oscillator operable to produce a pilot tone for injection prior to the main amplifier and including a means for programming the frequency of the pilot tone;
a phase shifter for shifting the phase of the oscillating signal to generate a phase-shifted signal; and
a receiver circuit connected to the phase shifter and to the error-correction pathway for detecting the level of the pilot tone in an output of the feed forward amplifier, the receiver circuit connected to the error-correction pathway so that the error pathway is operable introduce a correctional signal prior to the output of the feed-forward amplifier in order to substantially eliminate the pilot tone and any error-correction introduced by the main amplifier from the output of the feed-forward amplifier, wherein the receiver circuit comprises a mixer for mixing a portion of the output of the feed forward amplifier with the phase-shifted signal to produce a DC voltage corresponding to the level of the pilot tone in the output of the feed forward amplifier.

19. A feed-forward amplifier comprising:
an amplifier portion including a main amplifier and an error-correction pathway; and
a pilot-tone generator-receiver operable to both inject a pilot tone into said amplifier portion and detect the pilot tone at the output thereof, the generator-receiver having an oscillator operable to produce an oscillating signal, a means for either increasing or decreasing the frequency of the oscillating signal by an intermediate frequency so as to generate the pilot tone, so that the frequency of the pilot tone injected prior to the main amplifier is either greater than or less than the frequency of the oscillating signal by the intermediate frequency, and a receiver circuit connected to the oscillator and to the error-correction pathway for detecting the level of the pilot tone in an output of the feed forward amplifier, the receiver circuit connected to the error-correction pathway so that the error-correction pathway is operable to introduce a correctional signal prior to the output of the feed-forward amplifier in order to substantially eliminate the pilot tone and any error introduced by the main amplifier from the output of the feed-forward amplifier.

20. A feed-forward amplifier comprising:
an amplifier portion includes a main amplifier and an error-correction pathway; and a pilot-tone generator-receiver operable to both inject a pilot tone into said amplifier portion and detect the pilot tone at the output thereof, said generator-receiver having an oscillator operable to produce the pilot tone for injection prior to the main amplifier, a means for either increasing or decreasing the frequency of the pilot tone produced by the oscillator so as to a generate frequency-translated signal, and a receiver circuit connected to the frequency translating means and to the error-correction pathway for detecting the level of the pilot tone in an output of the feed forward amplifier, the receiver circuit connected to the error-correction pathway so that the error-correction pathway is operable to introduce a correctional signal prior to the output of the feed-forward amplifier in order to substantially eliminate the pilot tone and any error introduced by the main amplifier from the output of the feed-forward amplifier.

21. A method for generating and receiving a pilot tone for a feed-forward amplifier having a main amplifier, an error-correction pathway, and an output, said method comprising the steps of:
producing an oscillating signal;
increasing or decreasing the frequency of the oscillating signal by an intermediate frequency to generate a pilot tone for injection prior to the main amplifier, so that the frequency of the pilot tone injected prior to the main amplifier is either greater than or less than the frequency of the oscillating signal by the intermediate frequency;
injecting the pilot tone prior to the main amplifier;
mixing a portion of the output of the feed forward amplifier with the oscillating signal to produce a mixed signal;
filtering the mixed signal to pass the intermediate frequency so as to produce a filtered signal; and
detecting the level of the filtered signal.

22. A method for generating and receiving a pilot tone for a feed-forward amplifier having a main amplifier, an error-correction correction pathway, and an output, said method comprising the steps of:
producing an oscillating signal;
increasing or decreasing the frequency of the oscillating signal by an intermediate frequency to generate a frequency-translated signal, so that the frequency-translated signal is either greater than or less than the frequency of the oscillating signal by the intermediate frequency;
injecting the oscillating signal as a pilot tone prior to the main amplifier;
mixing a portion of the output of the feed forward amplifier with the frequency-translated signal to produce a mixed signal;
filtering the mixed signal to pass the intermediate frequency so as to produce a filtered signal; and
detecting the level of the filtered signal.

* * * * *